(12) United States Patent
Mai et al.

(10) Patent No.: US 9,556,517 B2
(45) Date of Patent: Jan. 31, 2017

(54) GAS SEPARATION

(71) Applicant: Roth & Rau AG, Hohenstein-Ernsttahl (DE)

(72) Inventors: Joachim Mai, Nobitz (DE); Daniel Decker, Ehrenfriedersdorf (DE); Stefan Helbig, Schmölln (DE); Oliver Loewel, Hohenstein-Ernsttahl (DE)

(73) Assignee: Meyer Burger (Germany) AG, Hohenstein-Ernstthal (DE)

( * ) Notice: Subject to any disclaimer, the term of this patent is extended or adjusted under 35 U.S.C. 154(b) by 106 days.

(21) Appl. No.: 14/416,063

(22) PCT Filed: Jul. 23, 2013

(86) PCT No.: PCT/EP2013/065513
§ 371 (c)(1),
(2) Date: Jan. 21, 2015

(87) PCT Pub. No.: WO2014/016297
PCT Pub. Date: Jan. 30, 2014

(65) Prior Publication Data
US 2015/0225847 A1    Aug. 13, 2015

(30) Foreign Application Priority Data
Jul. 25, 2012  (DE) .......... 10 2012 213 095

(51) Int. Cl.
*C23C 16/44*    (2006.01)
*C23C 16/455*    (2006.01)
(Continued)

(52) U.S. Cl.
CPC ......... *C23C 16/4412* (2013.01); *C23C 14/564* (2013.01); *C23C 16/4401* (2013.01);
(Continued)

(58) Field of Classification Search
CPC ............. C23C 16/4412; C23C 16/4401; C23C 16/458; C23C 16/4582; C23C 16/4583; C23C 16/455; C23C 16/45502; C23C 14/564; C23C 16/54
See application file for complete search history.

(56) References Cited

U.S. PATENT DOCUMENTS 4,949,669 A * 8/1990 Ishii ................. H01L 21/67017
118/719
6,200,389 B1 * 3/2001 Miller ................. C03C 17/002
118/715
(Continued)

FOREIGN PATENT DOCUMENTS

DE    102008026001 B4    2/2012
JP    WO 2015050172 A1 *    4/2015 ........... C23C 16/455

*Primary Examiner* — Jeffrie R Lund
(74) *Attorney, Agent, or Firm* — Michael Soderman (57) ABSTRACT

A device for gas movement in vacuum-coating systems is disclosed that extracts gaseous coating material in the coating chamber that has not been deposited on the substrates to be coated. At least one pump for extracting the coating material is connected to it in an axial extension of the suction device; the suction device has one or more suction openings and is divided up into at least two axial areas whose suction characteristics can be adjusted separately from one another to a great extent.

18 Claims, 8 Drawing Sheets

(51) Int. Cl.
*C23C 16/458* (2006.01)
*C23C 16/54* (2006.01)
*C23C 14/56* (2006.01)

(52) U.S. Cl.
CPC .......... *C23C 16/455* (2013.01); *C23C 16/458* (2013.01); *C23C 16/4582* (2013.01); *C23C 16/4583* (2013.01); *C23C 16/45502* (2013.01); *C23C 16/54* (2013.01)

(56) References Cited

U.S. PATENT DOCUMENTS

| | | | | |
|---|---|---|---|---|
| 6,626,997 B2 * | 9/2003 | Shapiro | ............... | C23C 16/4412 118/715 |
| 2003/0143134 A1 | 7/2003 | Jeong et al. | | |
| 2005/0241761 A1 * | 11/2005 | Kannan | ............... | C23C 16/4405 156/345.24 |
| 2008/0264338 A1 * | 10/2008 | Otsuki | ................ | C23C 16/4405 118/712 |
| 2008/0317956 A1 * | 12/2008 | Reber | ................. | C23C 16/4401 427/255.28 |
| 2009/0304924 A1 * | 12/2009 | Gadgil | ................ | C23C 16/4412 427/255.5 |
| 2011/0087378 A1 * | 4/2011 | Kim | ...................... | C23C 14/564 700/282 |
| 2012/0196050 A1 * | 8/2012 | Vermeer | ........... | C23C 16/45551 427/535 |
| 2014/0030445 A1 * | 1/2014 | Vermeer | ........... | C23C 16/45551 427/569 |
| 2014/0037847 A1 * | 2/2014 | Vermeer | ........... | C23C 16/45551 427/255.28 |
| 2014/0044887 A1 * | 2/2014 | Vermeer | ............. | C23C 16/4401 427/535 |
| 2015/0225847 A1 * | 8/2015 | Mai | ....................... | C23C 14/564 118/729 |

\* cited by examiner

GAS SEPARATION

CROSS-REFERENCE TO RELATED APPLICATIONS

This application is the U.S. national stage of International Application No. PCT/EP2013/065513 filed on Jul. 23, 2013, and claims the benefit thereof. The international application claims the benefit under 35 USC 119 of German Application No. DE 10 2012 213 095.0 filed on Jul. 25, 2012; all applications are incorporated by reference herein in their entirety.

BACKGROUND

The subject matter of this invention is a device for moving gas, especially related to the suction extraction of gas for gas atmospheres in systems that produce coatings on substrates.

Substrates are frequently coated with thin layers of one element or with compounds with the PECVD process (plasma enhanced chemical vapour deposition) or with the PVD process (physical vapour deposition) in the solar and semiconductor industries. Sputtering, thermal vaporization, laser and ion-beam vaporization, plasma coatings and other processes known from the prior art are used here. These processes are frequently carried out in continuous-operation systems that have processing chambers designed in the form of vacuum chambers; the substrates to be coated are moved through them in a continuous or discontinuous (step-by-step) fashion and coated in the process.

The coating or other working materials are frequently in a gaseous form. Portions that are not deposited on the substrate can therefore spread out in the treatment chamber in an uncontrolled fashion. It is therefore desirable to suction off these gases in a controlled manner without interference with the coating or processing actions caused by flow profiles.

Several layers of different materials are frequently applied to a substrate in direct succession. It is advantageous in cases of that type when there is no requirement for complex inward and outward transfers in different treatment chambers, but instead when the successive coatings can be performed in one and the same treatment chamber. It can be problematic here when the various coating materials are not compatible with one another and, for instance, react with one another in an undesirable way or when components of a coating material act as an impurity in the layer of a different material.

A series of technical approaches exist to solve this problem. In addition to small intermediate lock chambers and movable boundaries, the procedure of preventing the overflow of gaseous materials from one chamber area to another has especially prevailed. The gas flow is suctioned up for this, preferably at the boundaries of the treatment areas, and a separation of areas is achieved in that way.

WO2007/059749 describes a system with small intermediate lock chambers that the substrates are moved through via the transport system and that have flaps that alternatively cover the inlet or outlet opening of the intermediate lock chambers. Suctioning takes place in the lock-chamber area to remove the gas residues that are also transported.

DD214865A1 describes how separation is achieved between two coating areas in which work is one with plasmatrons; a first area has a highly reactive working gas, and the second area has a working gas with little reactivity; separation is achieved by increasing the pressure of the gas with little reactivity. Furthermore, suctioning is provided between the two areas. This prevents the highly reactive gas from penetrating into the second area.

A coating system for glass substrates is disclosed in DE4303462A1 in which the glass substrates are coated from above in a horizontal position in a continuous process. The coating areas are also separated here by providing suction units between them. In the solution that is described, suction takes place downwards from the bottom of the substrates and, in other embodiments, there is simultaneously suction between the coating areas, lateral to the targets from which the coating material is removed. On top of that, intermediate walls are used together with the other construction elements of the coating chamber that form a tube-like hollow area that has a rectangular cross-section. This hollow area has a slot acting as a gas inlet that is turned towards the side on which the target is located. The hollow area is evacuated via a vacuum pump at its ends on the side wall of the coating chamber.

The two devices according to DD214865A1 and DE4303462A1 have the common feature that gas is suctioned out of the coating chambers without consideration being given to the flow conditions that arise. It can therefore be expected that a gas flow that is very much stronger will arise in the proximity of the pump opening than at some distance to it. Since the pumps are typically in the side wall of the treatment chamber or are arranged over or under the substrate, a more even gas flow over the entire substrate that avoids influencing the coating process a bit cannot be expected.

DE102010028734A1 envisages the realization of gas separation between two coating areas by providing suction through an opening directly above the substrate surface that is flanked by metal sheets aligned in parallel with the substrate surface and intended to create flow resistance. Since the pressure loss is much greater around these flow-resistance sheets than the pressure loss behind them, the inventors think that they have achieved an evening out of the flow profile over the entire length of the suction device. The length of the suction device is to be viewed as perpendicular to the transport direction of the substrates and parallel to their surface. The suctioning is done via vacuum pumps that are arranged above the substrates.

DE 10 2008 026 001 B4 claims a method for creating a process atmosphere in continuous coating systems. In particular, it is envisaged that at least two coating areas will exist in the coating system that can have different gas atmospheres. The gas atmospheres are separated by providing a gas-supply unit and a gas-extraction system in every coating area. Furthermore, there is a description that the gas-extraction system is to be "created in the form of a gas channel (16) that extends over the substrate width, crosswise to the direction of transport (3) of the substrate (1) and that has at least one opening (20) so that the gas flow (22) is distributed between the substrate (1) and the gas channel (16) and over the width of the substrate". It is envisaged that a gas channel for gas supply will be located on the side of the coating source and that a gas channel for gas extraction will be located on the other side.

The customary arrangement of vacuum pumps directly above the substrates in the prior art prevents a structure that provides for several treatment areas on top of one another. Moreover, the suction extraction causes, because of the gap between the substrate and the flow guide plates, a strongly inhomogeneous flow that can lead to an uneven coating of the substrate surface. Especially in the case of plasma processes, for instance plasma etchings or a PECVD process, decomposition products or gas particles generated in the plasma sometimes have the characteristic of being able to also trigger reactions with the substrate surfaces in remote areas outside of the defined processing area. That can lead to disadvantageous changes to the surface characteristics, for instance changes to the homogeneity or to the passivation quality or optical properties etc.

SUMMARY

A device for gas movement in vacuum-coating systems is disclosed that extracts gaseous coating material in the coating chamber that has not been deposited on the substrates to be coated. At least one pump for extracting the coating material is connected to it in an axial extension of the suction device; the suction device has one or more suction openings and is divided up into at least two axial areas whose suction characteristics can be adjusted separately from one another to a great extent.

DETAILED DESCRIPTION

The problem consequently arises to propose a gas suction device that makes a defined gas movement possible in a coating chamber without hindering the formation of uniformly thick, homogeneous layers via strong flow differences in the coating chamber or with a controlled influence on the layer formation via specified flow differences.

This problem is solved in accordance with the invention by the device according to claim 1. Advantageous embodiments are disclosed in the dependent sub-claims.

The coating facilities for substrates are usually extended in an approximately linear way and arranged in parallel with the substrate surface and perpendicular to the direction of transport of the substrate. The substrate is preferably transported at a continuous speed below or above them. The coating material is deposited during this transport movement. The length of the coating devices corresponds to at least the width of the substrates or the substrate holders in which the substrates are transported to make the coating even. Gaseous material that does not completely settle and that has to be suctioned off consequently also arises over the entire length of the coating devices.

The device as per the invention has at least one coating chamber with at least one coating area. Furthermore, it has a transport device to transport flat substrates in a transport direction into the coating chamber and to hold the substrates in it. At least one coating device exists per coating area in the coating chamber. The coating device gives off gaseous coating material. Its length corresponds to at least the width of the substrate. There is at least one suction device per coating area; the suction device essentially extends in parallel to the coating device and has at least its length. At least one pump is connected to the suction device that creates low pressure in the interior of the suction device vis-a-vis the interior pressure of the coating chamber. In particular, the at least one pump is connected to the suction device as an axial extension of it. The suction device has one or more suction openings and is divided up into at least two axial areas whose suction characteristics can be adjusted separately from one another to a great extent. The suction openings are preferably arranged in such a way that the flow of suctioned gas runs in parallel with the substrate surface and not perpendicular to it. The suction openings are preferably in a plane that is perpendicular to the substrate surface for this.

The suction device preferably has a tube-in-tube design. Consequently, it has an internal tube and an external tube. The tube cross-sections can be identical or different. The internal tube and external tube preferably have a round cross-section. In a further preferred embodiment, the cross-sections are rectangular or nearly rectangular with rounded corners. The tubes can also be manufactured by joining individual shaped parts, such as tube halves, U plates and other shaped sheet-metal parts.

The internal tube has an exterior diameter that is less than the interior diameter of the external tube. The pump or pumps are connected to the internal tube, preferably to its rims. The internal tube has one or more intake openings through which the gas is sucked in from the intermediate space between the outside of the internal tube and the inside of the external tube. In a preferred embodiment, the intake openings can be changed with regard to their opening width. This is realized via shutters, for instance, via at least one further tube (baffle tube) that tightly fits the internal or external wall of the internal tube and can be twisted and/or displaced vis-a-vis the internal tube and has openings that partially close the intake openings. When several (at least two) baffle tubes of that type are used, the suction characteristics of the intake openings can be advantageously determined in dependence upon their axial position.

In a further preferred embodiment, the internal tube has a partition wall that divides it up into two suction areas for at least one pump each, pumping at the rims. A further preference is for this partition wall to be capable of movement.

In a further preferred embodiment, the internal tube can be twisted, i.e. the internal tube can be twisted along the circumference around its longitudinal axis. The internal tube is fixed in place at one end for this while the other end is twisted. The position of the intake openings and the flow profile that is generated in the intermediate space are changed because of that. In a further preferred embodiment, the internal tube is held in the middle and the two ends can be twisted. The central mount is preferably realized via a rigid partition wall that connects the internal tube to the external tube.

In a further preferred embodiment, the internal tube is connected via one or more partition walls to the external tube. The internal-tube sections that arise in this way can be individual changed with regard to their alignment (capable of axial twisting).

The external tube has the suction openings via which the gas is drawn in from the coating chamber into the intermediate space between the outside of the internal tube and the inside of the external tube. The intake openings of the internal tube preferably point away from the suction openings of the external tube. This measure alone already leads to a situation in which non-uniformities in the flow that are caused by the pressure loss in the internal tube and that can lead to an uneven suction pressure in the intermediate space are already balanced out in the intermediate space in part, and the suction pressure at the suction openings of the external tube can be equalized.

In a preferred embodiment, the external tube has flow guide plates on the outside that can be changed in terms of position and alignment via displacement or twisting.

In a further preferred embodiment, the external tube has baffle tubes analogous to the embodiments described with regard to the internal tube.

As a further preference, the external tube is divided up into at least two independent sections that can be twisted along the circumference. These sections are supported by intermediate walls that connect them to the internal tube or that are arranged on support structures accommodating them outside of the external tube and connecting them to the wall of the coating chamber and supporting them there. As a further preference, the external tube is to be capable of being twisted over its entire length or in sections. The external tube is clamped at one end for this, and the other end is twisted vis-a-vis the first one. A further preferred embodiment envisages a central holder (via a partition disk on the internal tube or via a support structure); the two ends can then be twisted independently of one another because of that. In yet another preferred embodiment, the twistable external tube can be clamped at both ends and twisted between them. The twisting can engage in the center or even off-center so that the twisted sections that arise are asymmetric. This is advantageously done via a device, capable of being moved in terms of its engagement point in the axial direction, that engages on the outside of the external tube. Paraxial raised sections, for instance, are provided on the external tube that a clamp or the like engages with.

The materials of the internal tube and the external tube can be the same or different. They are especially dependent upon the variation possibilities of the flow structure that is strived for. Internal or external tubes that only change with regard to their orientation (even in sections) are preferably made of stainless steel or aluminum alloys. Tubes that are designed to be twistable are preferably made of fabric or composite materials. Carbon-fiber fabrics or carbon-fiber composite materials are especially used here. Furthermore, steel-fiber braided tubes are suitable. In principle, the materials in the prior art that have already been used in coating systems are suitable.

They can also be adapted to the various processes via surface treatments such as roughness changes or additional coatings or via additional covering or lining parts to improve the adhesive properties or also to protect the material surfaces against aggressive gas particles. The covering or lining parts are preferably metal sheets, films or bands made of suitable materials or composite materials. These parts can be designed to be reticular, tissue-like, perforated or with a different type of profile. The service life of the device can be increased with that, or maintenance can be simplified to a considerable extent.

The suction device has at least one diffuser in a preferred embodiment that brings about a further equalization of the drawn-in gas flow. The diffuser can extend over sections of the suction device or over the entire suction device. As a preference, the diffuser is designed to be a labyrinth structure in the suction device in the intermediate space here between the outside of the internal tube and the inside of the external tube. The labyrinth is designed in such a way here that it has a pressure loss in the axial direction of the suction device that is very much smaller than the pressure loss along the circumference. The diffuser can be designed to be an arrangement of several short, paraxial flow guide plates in the process. Further preferred embodiments envisage a perforated or reticular paraxial structure that increases the pressure loss along the circumference; an equalization of the pressure in the intermediate space between the intake openings and the diffuser structures comes about because of that.

In a preferred embodiment, several internal tubes are arranged in an external tube.

As a preference, combinations of the measures described above that result from flow calculations will be used to develop a flow profile that meets the requirements.

The joint, superimposed opening geometry of the two openings will preferably be adjusted in a defined manner via an axial twisting of the internal tube vis-a-vis the guide plate arrangement. An effective fine adjustment of the gas-flow resistance, for instance, can therefore be achieved, and therefore of the gas-flow profile as well. If congruent openings of the internal tube and the baffle tube are not used, a gas-suction profile that can be locally changed is also conceivable via a twisting of the internal tube and/or the baffle tube. In a further design variant, additional intake openings can also be arranged at other angular positions, for instance, and also axial positions distributed over the jacket of the internal tube. A more complex adjustment of various flow resistances and their effect on the gas-flow profile can even be effected via an axial twisting of the internal tube. If the internal tube is provided with a rotary drive, an adjustment of gas-flow profiles of this gas-extraction system that can be changed in a time-varying fashion can also be achieved.

The suction device is preferably arranged next to a coating device in the coating chamber. This ensures, in an advantageous fashion, that coating gas that does not reach the substrate will be completely drawn off to the extent possible and will not be deposited in an uncontrolled manner. The service life of the system between two cleaning cycles can be advantageously increased in this way.

In a preferred embodiment, the gas-extraction system is used in such a way that it is directly next to a coating device; a baffle with a baffle opening is arranged between the coating device and the substrate in the process. This baffle ensures that gas from the coating device will only directly reach an intended area of the substrate. A portion of the substrate holder (if one is used) can be withdrawn from direct coating, for instance. The excess gas is therefore advantageously removed to a great extent from the treatment chamber by the gas-extraction system before it can pass through the baffle opening.

At least one magnetron that extends over the entire width of the substrate in a rod-shaped design is preferably used as a coating device. Further preferred embodiments envisage several magnetrons in a series arrangement that forms the rod-shaped design.

Other focal areas for the use of the gas-suction device as per the invention are in the field of further plasma-processing systems as a preference. This can involve surface processes such as cleaning, activation, functionalization, plasma etching and coatings. Scalable plasma sources are predominantly used. They can be scalable in either a linear sense or an area-related sense. The working pressure range is around $10^{-2}$ mbar up to a few mbar. The overall gas flow that is to be drawn off can be between a few sccm (standard cubic centimeters per minute) and a few thousand sccm.

The processing areas in the plasma processing equipment can also use different processing methods in connection with this. So pre-cleaning and coating, for example. Reactive processes can be advantageously separated vis-a-vis non-reactive processes. A separation of different doping-material areas is also possible. A defined process environment is to be created on the whole together with the processing sources. At the same time, the defined gas-flow influence in preferred embodiments is also supposed to make gas separation possible.

When the gas-suction device is used with sputter magnetrons or with ion-radiation sources, the pressure range is a few $10^{-4}$ mbar up to around $10^{-2}$ mbar. The overall gas flow is normally significantly lower than is the case in plasma processing systems.

Different dimensions of the gas separation device will then also result, in a manner customary for a person skilled in the art (flow calculation), with the different working pressures and overall gas flows. Appropriately adapted pumping techniques will then be used in the course of the technical implementation.

In particular, in combination with optional flow-resistance elements that separate the coating areas in a coating chamber from one another, the gas-extraction system in accordance with the invention can be used to operate different coating areas with a mechanical separation, for instance intermediate walls or lock chambers.

DETAILED DESCRIPTION OF THE PREFERRED EMBODIMENTS

Design Example

Figure 1:
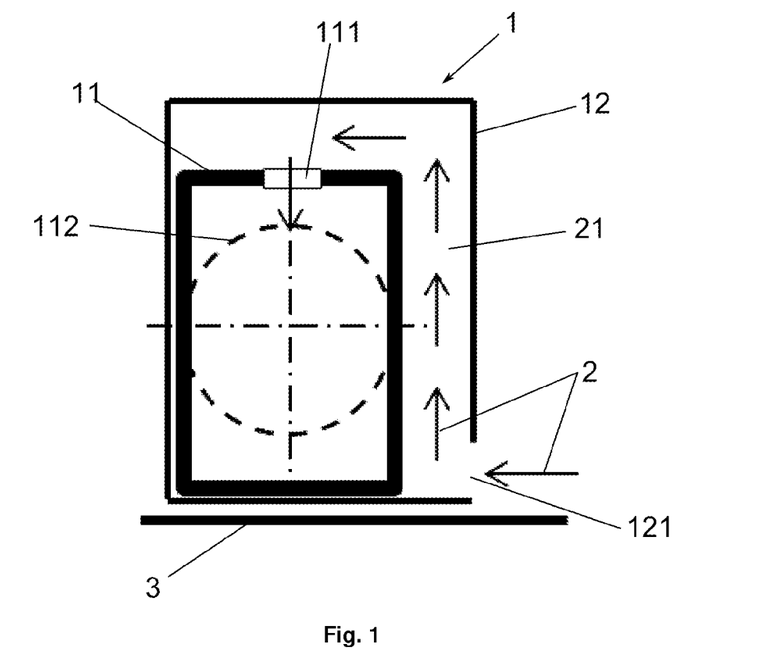

The design example refers to the embodiment shown in FIG. 1.

The cross-section of the internal tube (11) is rectangular and has the dimensions 8 cm×14 cm. The external tube is in the intermediate space (21), approximately 15 mm from the internal tube. The width of the suction opening (121) of the external tube is 12 mm. The suction opening (121) extends over the entire length of the external tube (12). The internal tube is manufactured from a standard rectangular tube made up of stainless steel sheets. Its wall thickness is approximately 2 mm. The external tube (12) is made of stainless steel sheets (sheet thickness approx. 1 mm). There are two suction openings (111) arranged next to one another at roughly the mid-length point of the internal tube (11). In intermediate metal plate that is not shown separates the internal tube (11) in a radial fashion in the middle of its overall length into two separately pumped tube sections. The suction openings are spaced approx. 60 mm apart. The width of each intake opening (111) is around 30 mm and the length is 250 mm. The overall length of the device is approximately 100 cm. A low pressure of 0.1 mbar to 0.5 mbar is created in the inner space of the internal tube (11) via the connection opening (112) of the vacuum pump. The volume flow that is extracted is 1,000 sccm-2,000 sccm (sccm—standard cubic centimeters). A gas flow (2) that is slightly strengthened towards the center is achieved via the special design and arrangement of the intake openings (111).

FIGURES

FIG. 1 shows a schematic diagram of an embodiment of the gas-extraction system (1) as per the invention. The gas-extraction device (1) is positioned above the substrate (3). The gas flow (2) is drawn into it via the low pressure in the intermediate space (21) between the external tube (12) and the internal tube (11). It is characteristic that the suction opening (121) is aligned in such a way that the gas flow (2) runs in parallel with the substrate surface and not perpendicular to it. The intermediate space (21) has a labyrinth-type design along the circumference. The gas flow (2) has to overcome several deflections to get to the intake opening (111) of the internal tube. Increased flow resistance in the radial direction is obtained in the intermediate space (21) because of these deflections. On the other hand, there is no labyrinth in the axial direction (perpendicular to the presentation plane) of the suction device. Pressure equalization in the axial direction therefore takes place in the intermediate space (21), which results in a low suction pressure that is uniform over the entire length of the suction opening (121). After passing the intake opening (111) of the internal tube (11), the gas flow (21) is extracted through connection openings (112) via pumps at both of the ends of the internal tube (11). The intake opening (111) and suction opening (121) that are shown are comprised of several slot-type or perforated openings; their arrangements and geometry result from flow calculations and/or technical optimization.

Figure 2:
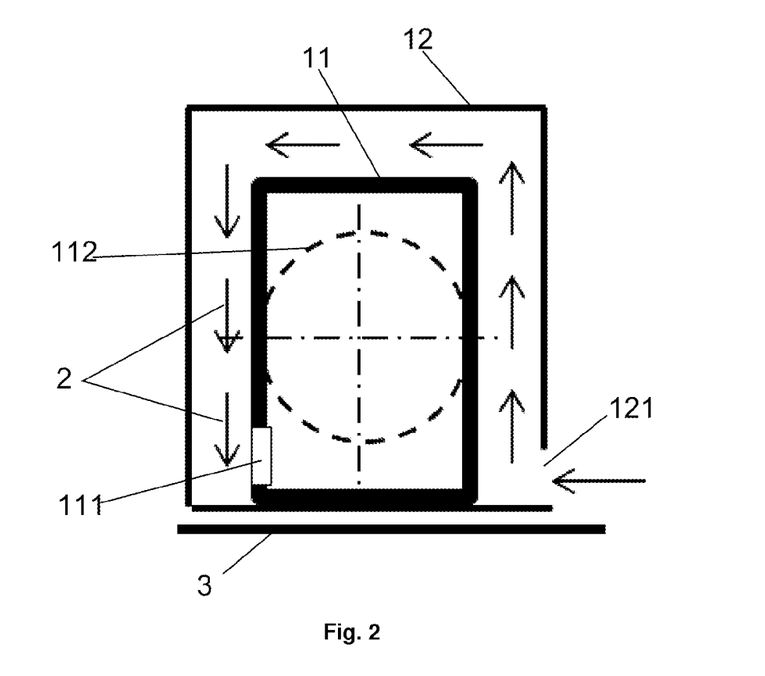

FIG. 2 shows a schematic diagram of a further embodiment of the gas-extraction system as per the invention. The labyrinth in the intermediate space (21) between the internal tube (11) and the external tube (12) has a more complex design because of a further deflection of the gas flow (21). This increases the possible flow resistance in a very narrow space and further improves the axial pressure equalization in the intermediate space (21).

Figure 3:
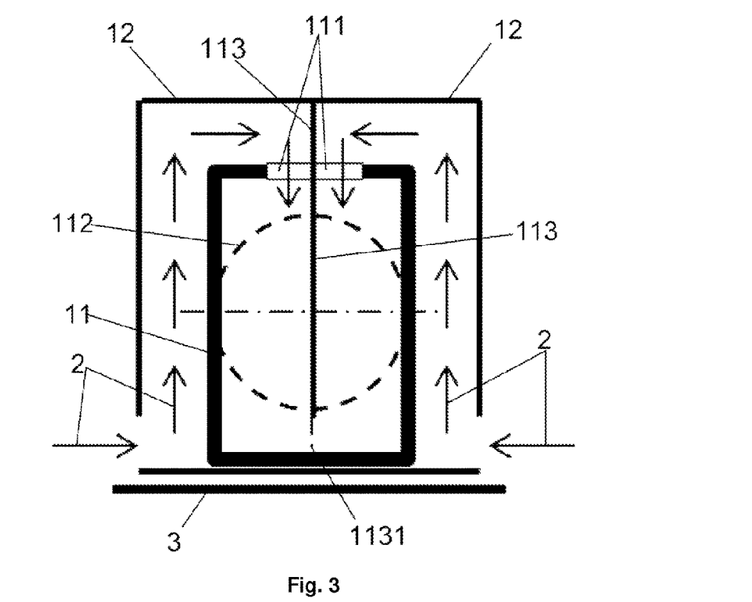

FIG. 3 shows a schematic diagram of a design that makes gas extraction (1) possible from two directions via a joint internal tube (11). The gas-extraction system can act as a gas-separation system in that way, because an escape of gas from one side of the gas-extraction system (1) to the other is prevented. The low pressure in the internal tube (11) is created via a vacuum pump that evacuates both parts of the internal tube separated by the intermediate wall (113). The intermediate wall (113) can also be left out in special cases. The gas separation vis-a-vis neighboring processing facilities does in fact drop somewhat, but the gas-extraction system continues to be very effective.

Figure 4:
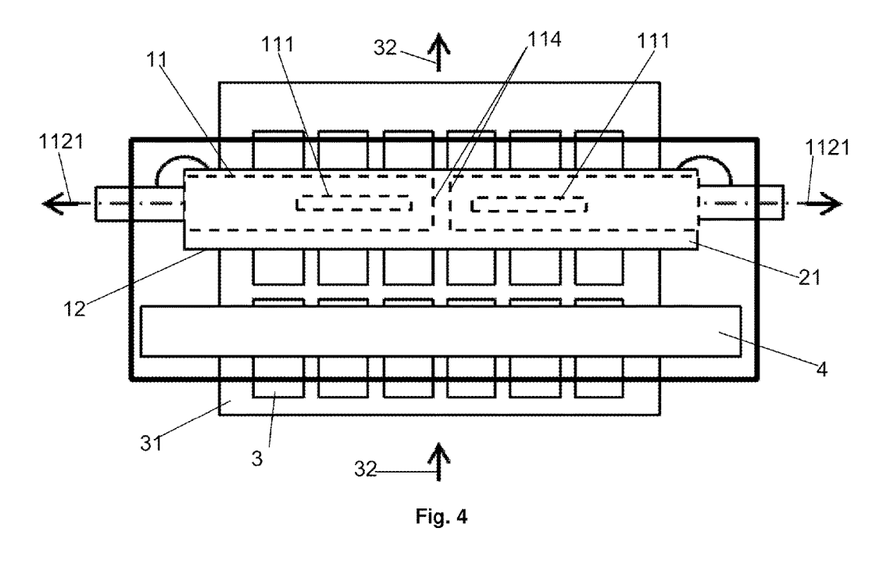

FIG. 4 shows a schematic diagram of the view in the direction of the substrate surface. The substrates are moved through under the gas-extraction system (1) in the direction of transport (32). The substrates (3), shown here as rectangular wafers, are arranged in a substrate holder (31). The coating device (4) contains at least one gas-supply device of its own. The excess gas that is not deposited on the substrate surface by the coating device is extracted from the coating chamber by the gas-extraction device (1) as per the invention. The internal tube is divided up into two tube sections that are each separately closed up by an intermediate wall (114). Every section of the internal tube (11) has an intake opening (111) in each case. A suction flow (1121) is extracted from every section of the internal tube (11) at the end closest to the wall of the coating chamber.

Figure 5:
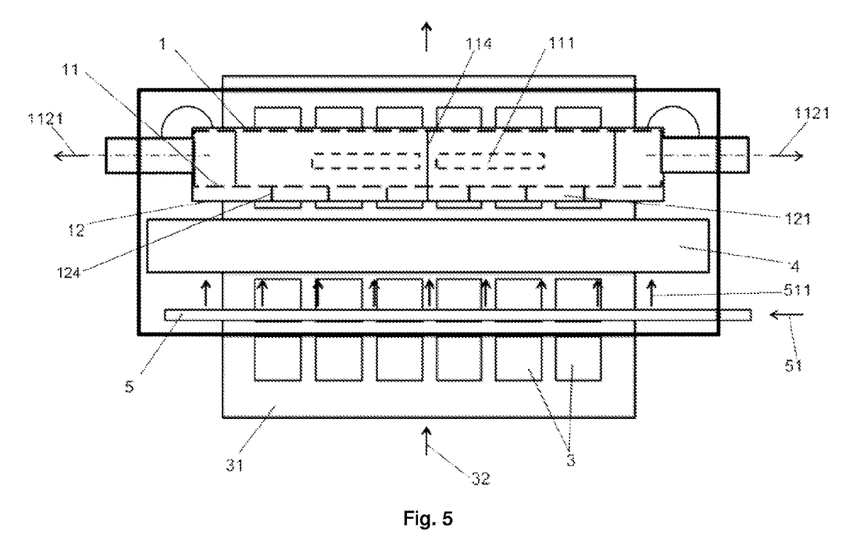

FIG. 5 likewise shows a schematic diagram of the view in the direction of the substrate surface. The substrates are moved through under the gas-extraction system (1) in the direction of transport (32). The substrates (3), shown here as rectangular wafers, are arranged in a substrate holder (31). A gas flow (511) is injected through the gas-supply device (5) into the space between the substrate surface and the coating device (4). The excess gas that is not deposited on the substrate surface by the coating device is extracted from the coating chamber by the gas-extraction device (1) as per the invention. The external tube 12 has suction openings (121) for this that are separated from one another by flow guide plates (124). Additional restricted guidance of the gas flow and a separation of the pumping action to individual areas of the suction opening (121) are achieved with that. The intermediate wall (114) divides both the external tube (12) and the internal tube (11) into two tube sections that have separate suction characteristics. Each section of the internal tube (11) has an intake opening (111). A suction flow (1121) is extracted from every section of the internal tube (11) at the end closest to the wall of the coating chamber.

Figure 6:
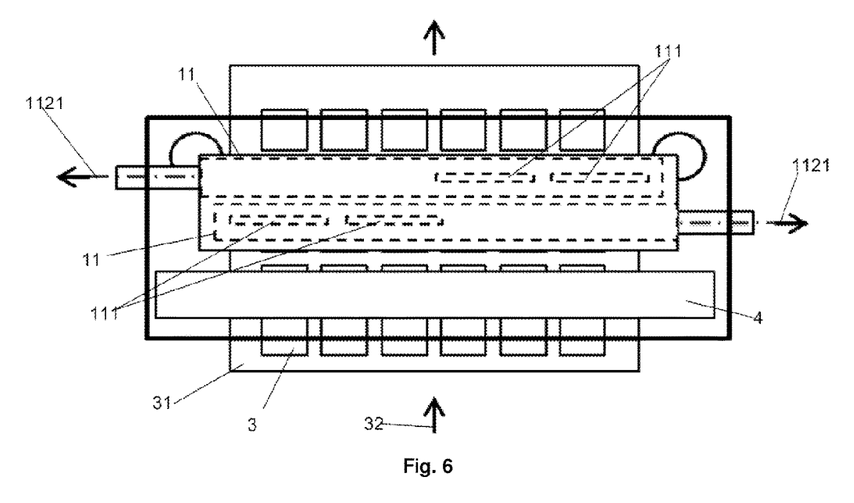

FIG. 6 shows a schematic diagram of the view in the direction of the substrate surface. The substrates are moved through under the gas-extraction system (1) in the direction of transport (32). The substrates (3), shown here as rectangular wafers, are arranged in a substrate holder (31). A gas flow is injected through the gas-supply device of the coating device (4) into the space between the substrate surface and the coating device (4). The excess gas that is not deposited on the substrate surface by the coating device is extracted from the coating chamber by the gas-extraction device (1) as per the invention. Two separate internal tubes (11) that are one behind the other in the direction of transport (32) are located in the external tube (12). Every section of the internal tube (11) has an intake opening (111). A suction flow (1121) is extracted from every section of the internal tube (11) at the end closest to the wall of the coating chamber. Mutually overlapping suction flows can be achieved with regard to the substrates (3) because of the offset arrangement of the internal tubes (11) and an adjusted position of the suction openings (111).

Figure 7:
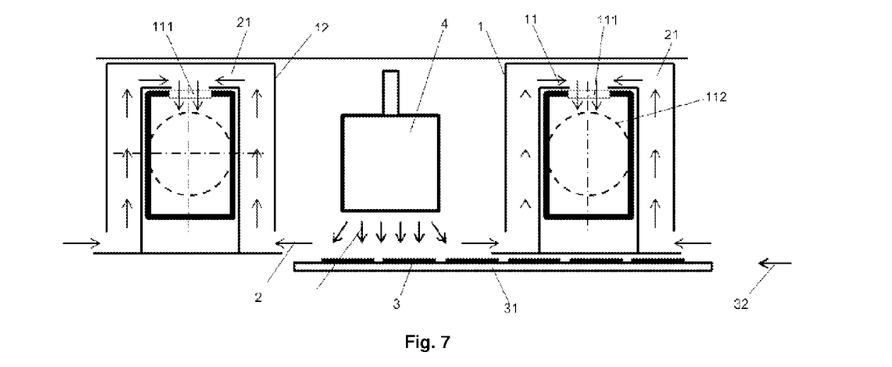

FIG. 7 shows a schematic diagram of the way in which the gas-extraction system as per the invention is used on connection with a coating device (4). The substrates (3) are moved along horizontally under the coating device (4). The coating material coming out of the coating device (4) is gaseous, and it is deposited on the substrate (3). Excess coating material is extracted in parallel with the substrate surface via the two gas-extraction systems (1) that are located in front of and behind the coating device (4), viewed in the direction of transport (32). The gas-extraction systems (1) are designed in such a way that an external tube (12) has openings to two neighboring coating devices (4). This is especially advantageous when the gases of the neighboring coating devices are identical or that they at least do not react with one another.

Figure 8:
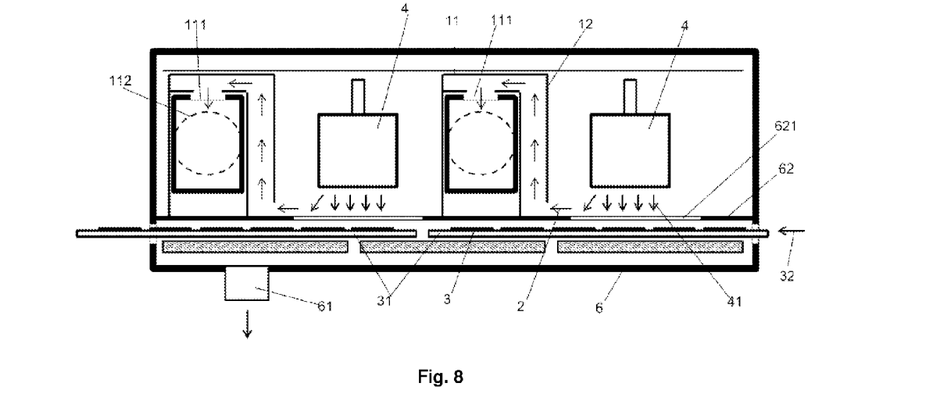

FIG. 8 shows a schematic diagram of an embodiment in which each coating device (4) is assigned to a gas-extraction system (1). A baffle (62) that has an opening (621) is arranged between the coating device (4) and the surface of the substrate (3). This ensures that the predominant part of the coating material is deposited on the substrate (3) and not on the edge areas of the substrate holder (31). In addition, the opening geometry of the baffle (62) can be adjusted in such a way that especially homogeneous layer deposits are achieved with regard to the layer thickness uniformity and also with regard to the layer composition.

Figure 9:
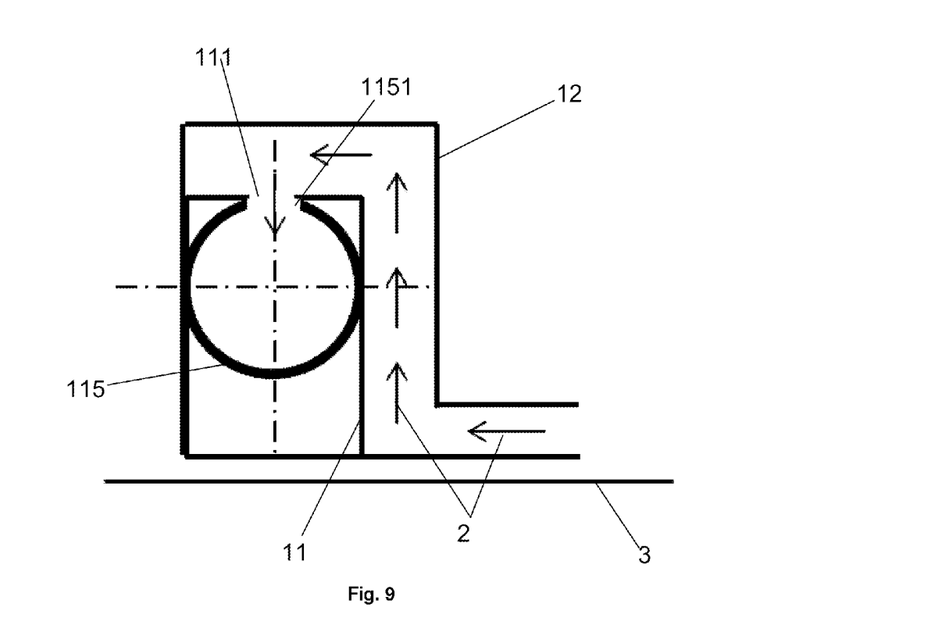

FIG. 9 shows a schematic diagram of a design variant of the gas-extraction system as per the invention with an internal tube (11) that has a circular cross-section. The internal tube (11) is encased in a rectangular guide plate arrangement (115). The intake opening (111) of the internal tube (11) and the opening (1151) of the guide plate arrangement (115) are congruent in the diagram. The joint, overlapping opening geometry of the two openings (111 and 1151) can be set in a defined way via axial twisting of the internal tube (11) vis-a-vis the guide plate arrangement (115). An effective fine adjustment of the gas-flow resistance, for instance, can therefore be achieved, and therefore of the gas-flow profile as well. The guide plate arrangement (115) can also be designed in such a way, for instance, that it will only extend to roughly half the diameter of the internal tube (11), viewed from the substrate side. The guide plate arrangement will therefore more or less have the shape of a U plate that can be fastened laterally, for instance, to the internal tube (11) and that has a base closed towards the substrate side. The guide plate arrangement will then have no openings (1151).

Figure 10:
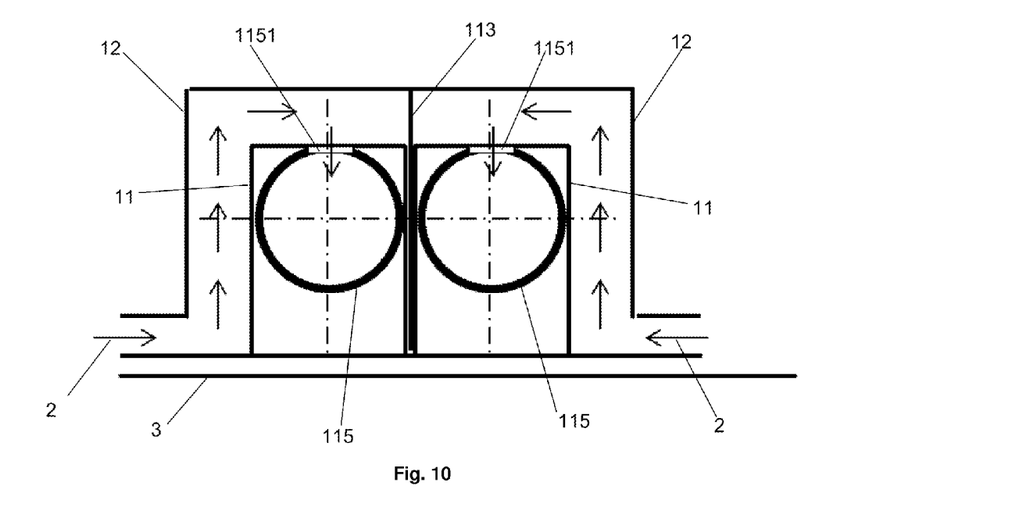

FIG. 10 shows the design according to FIG. 9 in an adjacent, mirror-symmetrical design. A gas-extraction system arises in this way that provides suction extraction both in the direction of transport and also in the opposite direction, but that is suitable for different gas types.

Figure 11:
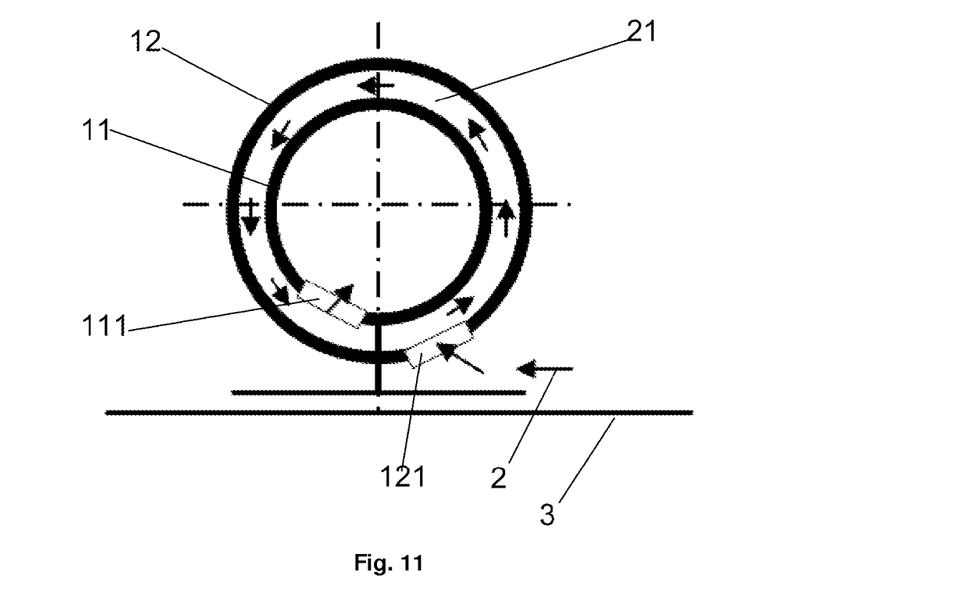

FIG. 11 shows a schematic diagram of a tube-in-tube design with a round cross-section. The labyrinth formation for the gas flow (2) is realized here by having the intake opening (111) of the internal tube (11) as far away as possible from the suction opening (121) of the external tube (12).

Figure 12:
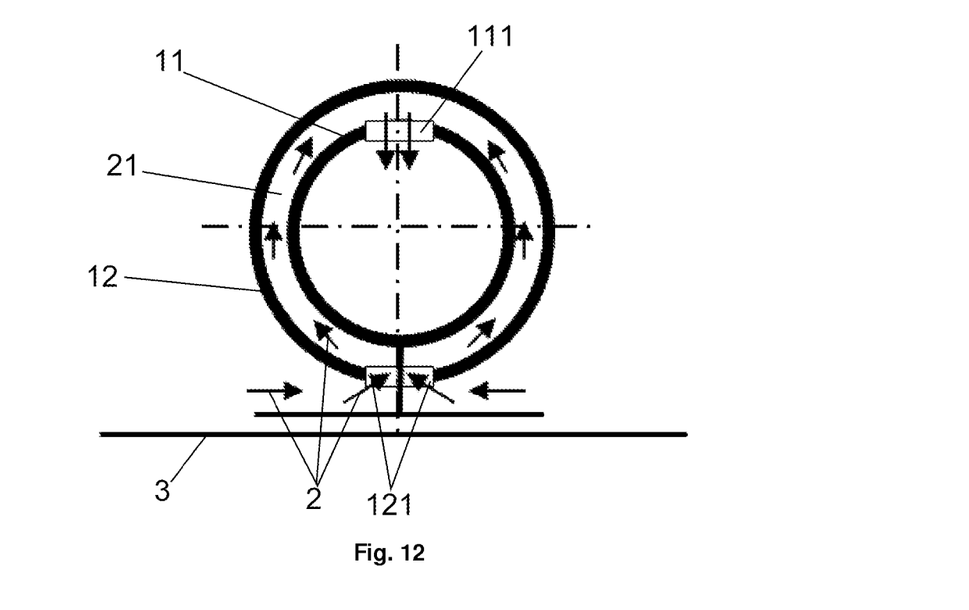

FIG. 12 shows a schematic diagram of a design variant of the gas-extraction system as per the invention with tubes with round cross-sections that is equivalent to FIG. 11. The gas-extraction systems (1) are designed in such a way here, however, that an external tube (12) has a divided intake opening (121) to two neighboring coating devices (4). This is especially advantageous when the gases of the neighboring coating devices are identical or that they at least do not react with one another.

Figure 13:
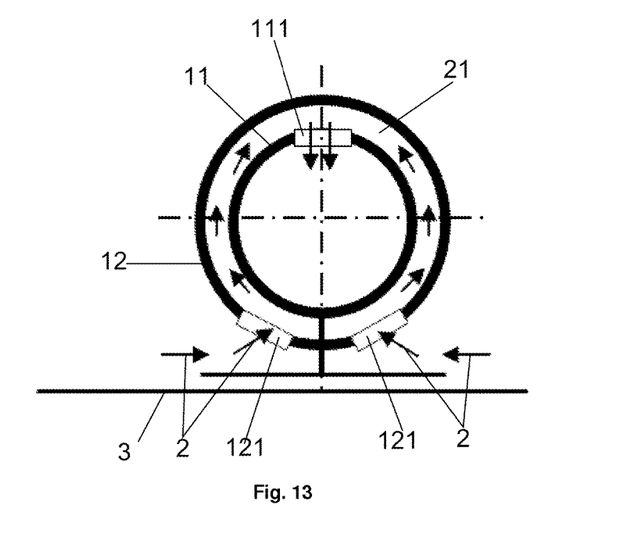

FIG. 13 corresponds to the diagram in FIG. 12, wherein the suction opening (121) is not divided here; instead, an independent suction opening (121) is realized to a neighboring coating device in every direction.

Figure 14:
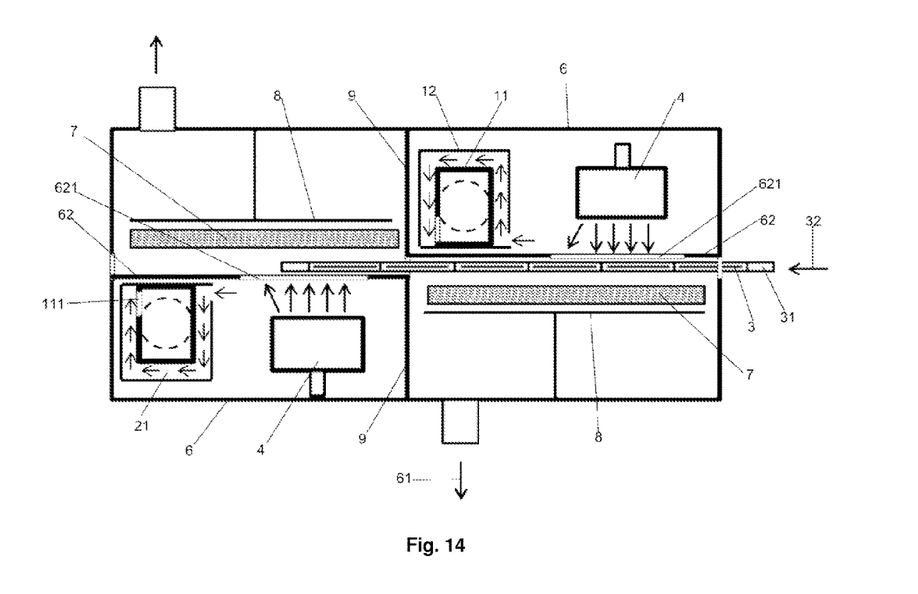

FIG. 14 shows a schematic diagram of how the gas-extraction system as per the invention can be used in a coating chamber (6) for successive coatings of the front and back sides of the substrate (3). The substrates (3) are held in a substrate holder (31) and are moved on it into the coating chamber (6) in the direction of transport (32). The coating device (4) is separated from the substrate surface by a baffle (62) with a baffle opening (621). The baffle opening (621) releases the areas that are to be coated (the substrates) and covers, for instance, large parts of the substrate holder (for instance the external frame) whose coating is not desired. Furthermore, the baffle brings about an increase in the flow resistance between the top of the substrate and the baffle. Excess gas will be captured more easily by the gas-extraction system as per the invention and removed from the coating chamber (6) because of that, before it can penetrate into the area of the coating of the bottom of the substrate (3). The substrate holder (31) with the substrates (3) is now moved along to the part of the coating chamber (6) where the back sides of the substrates (3) are coated. This part is essentially identical to the part involving the coating of the top, but coating is done from below. The flow resistance increased by the baffle also ensures here that the coating gas for the bottom cannot penetrate or can only penetrate with difficulty into the coating area for the top. The coating areas involving the coating of the top and bottom are evacuated separately from one another via independent vacuum-generation units (61) in the design that is shown. The coating areas are separated by an intermediate wall (9) in the coating chamber (6). Heating plates (7) are provided to temper the substrates (3) and the substrate holder (31). Radiation shields (8) ensure that there is effective heating action in the direction of the substrate holder (31) and reduce possible radiation losses to the chamber walls.

Figure 15:
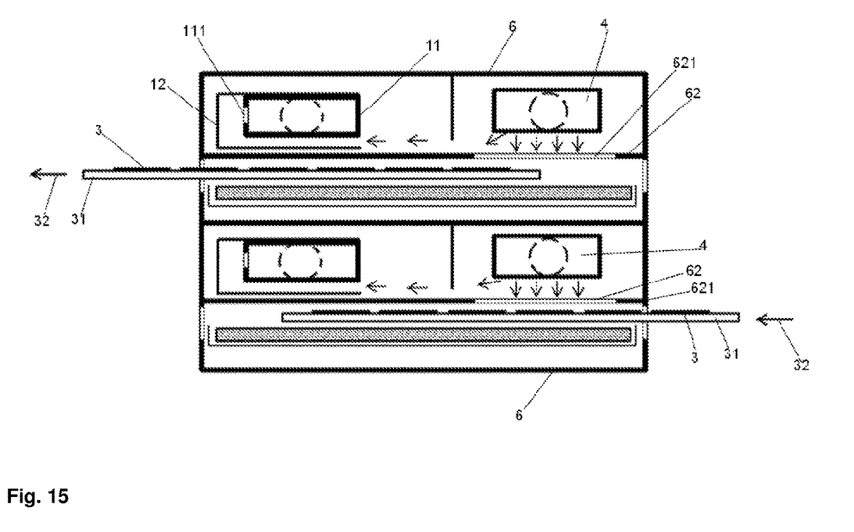

FIG. 15 shows a schematic diagram of a special space-saving embodiment of the coating device. Two treatment chambers (6) are arranged one over the other. The substrates (3) are also separated from the coating device (4) by baffles (62) here. The advantage of the design of the gas-extraction system as per the invention with an axial arrangement of pumping devices towards the chamber wall of the treatment chamber (6) is shown here in the form of an example.

The most important features of the figures that are described can also be combined with one another in principle. Several identical or even different gas-extraction devices can be used inside a processing chamber. Several processing chambers can also be assembled one after the other into a more complex processing system. The various possible functions of the suction device as per the invention, such as defined gas extraction, a gas-flow profile adaptation or gas separation, can be realized individually or also in a combined form.

LIST OF REFERENCE NUMERALS

1 Gas-extraction device
11 Internal tube
111 Intake opening wall of the internal tube
112 Connection opening of the vacuum pump
1121 Suction flow of the vacuum pump from the internal tube
113 Axial intermediate wall in the internal tube
1131 Opening in the axial intermediate wall in the internal tube
114 Radial intermediate wall in the internal tube
115 Guide plate arrangement
1151 Opening in the guide plate arrangement
12 External tube
121 Suction opening of the external tube
123 Axial intermediate wall in the external tube
124 Flow guide plates
2 Gas flow
21 Intermediate space between the internal tube and the external tube
3 Substrate
31 Substrate holder
32 Direction of transport
4 Coating device
41 Coating gas
42 Plasma
5 Gas-supply device
51 Incoming gas
511 Gas flow in the coating chamber
6 Coating chamber
61 Vacuum generation unit of the coating chamber
62 Baffle
621 Opening of the baffle
7 Heating plate
8 Radiation shield
9 Intermediate wall in the coating chamber

The invention claimed is:

1. Device for gas movement in vacuum-coating systems, comprising
at least one coating chamber with at least one coating area,
a transport device to transport flat substrates in a direction of transport into the coating chamber and to hold the substrates in it,
at least one coating device per coating area that gives off gaseous coating material, wherein the length of the coating device is equal to at least the width of the substrate,
at least one suction device per coating area, wherein the suction device
essentially extends in parallel to the coating device and has at least the length of it,
at least one connected pump that is suitable for generating a low pressure with respect to the internal pressure of the coating chamber in the interior of the suction device,
characterized in that
the at least one pump is connected to the suction device in an axial extension of it,
the suction device has one or more suction openings,
the suction device has at least two axial areas whose suction characteristics can be adjusted separately from one another.

2. Device according to claim 1, characterized in that at least one diffusor unit is provided in the interior of the suction device.

3. Device according to claim 2, characterized in that the diffusor unit is a labyrinth that is structured in such a way that it has a pressure loss in the linear direction of the suction device that is very much smaller than the pressure loss along the circumference.

4. Device according to claim 3, characterized in that the labyrinth is formed by putting an internal tube in the interior of the suction device that at least one pump is connected to and that has one or more intake openings along its longitudinal extension that are facing away from the suction openings.

5. Device according to claim 4, characterized in that the intake openings can be changed in terms of their opening widths.

6. Device according to claim 4, characterized in that the internal tube can be twisted over its entire length.

7. Device according to claim 6, characterized in that the internal tube is rigidly connected in at least one place to an external tube via an intermediate wall, and internal-tube sections of the internal tube that arise in the process can be twisted along the circumference independently of one another.

8. Device according to claim 4, characterized in that the internal tube has flow guide plates on its outside that influence the flow running through the intake openings.

9. Device according to claim 8, characterized in that the flow guide plates can be moved axially on the internal tube.

10. Device according to claim 4, characterized in that the internal tube is provided with at least one rotary drive that rotates the internal tube around its longitudinal axis completely or in sections in the course of a treatment of the substrates.

11. Device according to claim 3, characterized in that the labyrinth is formed by putting an internal tube in the interior of the suction device, dividing the internal tube with a partition wall and providing suction via pumps arranged at each end of the internal tube.

12. Device according to claim 11, characterized in that the partition wall is positioned roughly in the middle.

13. Device according to claim 11, characterized in that the partition wall is axially fixed in place and the internal tube is divided up into two internal-tube sections because of that.

14. Device according to claim 13, characterized in that the internal-tube sections can be rotated along their longitudinal axes separately from one another.

15. Device according to claim 13, characterized in that the internal-tube sections can be twisted and rotated along the circumference separately from one another.

16. Device according to claim 11, characterized in that the partition wall is axially moved along the axial extension of the internal tube.

17. Device according to claim 1, characterized in that the suction device has flow guide plates on the outside.

18. Device according to claim 17, characterized in that the flow guide plates on the suction device can be moved axially.

* * * * *